US011887809B2

(12) United States Patent
Deng et al.

(10) Patent No.: US 11,887,809 B2
(45) Date of Patent: Jan. 30, 2024

(54) AUTO-TUNING STAGE SETTLING TIME WITH FEEDBACK IN CHARGED PARTICLE MICROSCOPY

(71) Applicant: FEI Company, Hillsboro, OR (US)

(72) Inventors: Yuchen Deng, Eindhoven (NL); Erik Franken, Nuenen (NL); Bart van Knippenberg, Helden (NL); Holger Kohr, Eindhoven (NL)

(73) Assignee: FEI Company, Hillsboro, OR (US)

( * ) Notice: Subject to any disclaimer, the term of this patent is extended or adjusted under 35 U.S.C. 154(b) by 77 days.

(21) Appl. No.: 17/582,769

(22) Filed: Jan. 24, 2022

(65) Prior Publication Data
US 2023/0238207 A1 Jul. 27, 2023

(51) Int. Cl.
*H01J 37/20* (2006.01)
*H01J 37/26* (2006.01)
*H01J 37/28* (2006.01)

(52) U.S. Cl.
CPC .......... *H01J 37/20* (2013.01); *H01J 37/265* (2013.01); *H01J 37/28* (2013.01)

(58) Field of Classification Search
CPC .......... H01J 37/00; H01J 37/02; H01J 37/023; H01J 37/20; H01J 37/21; H01J 37/22; H01J 37/222; H01J 37/24; H01J 37/265; H01J 37/26; H01J 37/28
USPC .......................................... 250/306, 307, 311
See application file for complete search history.

(56) References Cited

U.S. PATENT DOCUMENTS

2015/0348751 A1* 12/2015 Brogden ............. H01J 37/3023
250/307
2018/0286724 A1* 10/2018 Xu .......................... H01J 37/28

2019/0287759 A1* 9/2019 Own ....................... H01J 37/26
2021/0112203 A1* 4/2021 Walden ................... G06T 7/215
2022/0115203 A1* 4/2022 Bizen ..................... H01J 37/244
2022/0310354 A1* 9/2022 Shánel ................. G01N 23/046

FOREIGN PATENT DOCUMENTS

JP         2018-137275         8/2018

OTHER PUBLICATIONS

Extended EP Search Report for related Application No. EP 23153015.5, datd Jun. 13, 2023, 9 pages.
Suloway et al., "Automated molecular microscopy: The new Leginon system." *Journal of Structural Biology*, 151(1):41-60 (Jul. 1, 2005).
Van Horssen et al., "Image-based feedback control for drift compensation in an electron microscope," *IFAC Journal of Systems and Control*, 11(100074):1-15 (Jan. 31, 2020).

* cited by examiner

*Primary Examiner* — Jason L McCormack
(74) *Attorney, Agent, or Firm* — Klarquist Sparkman, LLP

(57) ABSTRACT

Computer-implemented methods for controlling a charged particle microscopy system include estimating a drift of a stage of the charged particle microscopy system based on an image sequence, and automatically adjusting a stage settling wait duration based on the drift estimate. Charged particle microscopy systems include an imaging system, a movement stage, and a processor and memory configured with computer-executable instructions that, when executed, cause the processor to estimate a stage settling duration of the movement stage based on an image sequence obtained with the imaging system, and automatically adjust a stage settling wait duration for the movement stage based on the stage settling duration.

20 Claims, 6 Drawing Sheets

AUTO-TUNING STAGE SETTLING TIME WITH FEEDBACK IN CHARGED PARTICLE MICROSCOPY

FIELD

The field is charged particle microscopy.

BACKGROUND

In microscopy, a sample supported by a movement stage is situated in view of a probe beam. The beam is directed to the sample and beam particles or other particles that are transmitted, scattered, or emitted by the sample are then detected so as to form an image of the sample. The sample can be moved with the movement stage to various positions or orientations so that different areas or perspectives can be imaged.

SUMMARY

According to an aspect of the disclosed technology, computer-implemented methods for controlling a charged particle microscopy system include estimating a drift of a stage of the charged particle microscopy system based on an image sequence, and automatically adjusting a stage settling wait duration based on the drift estimate. Some examples further include acquiring an image of a sample after the adjusted stage settling wait duration has elapsed. Some examples further include moving the stage to a first location, wherein the image sequence is acquired at the first location, and moving the stage to a second location, wherein the image of the sample is acquired at the second location after the adjusted stage settling wait duration. Some examples further include moving the stage to a first location, wherein the image sequence is acquired at the first location, wherein the estimating the drift comprises estimating the drift of the stage based on the image sequence after the movement to the first location, the automatically adjusting comprises adjusting the stage settling wait duration during the settling of the stage at the first location, and the acquiring the image of the sample comprises acquiring the image at the first location after the adjusted stage settling wait duration. In some examples the automatically adjusting the stage settling wait duration comprises estimating a stage settling duration based on the drift estimate, and adjusting the stage settling wait duration by a fixed amount in response to a change in the stage settling duration estimate relative to a stored stage settling wait duration. In some examples, the automatically adjusting the stage settling wait duration comprises estimating a stage settling duration based on the drift estimate, and adjusting the stage settling wait duration to correspond to the stage settling duration estimate. In some examples, the estimating the stage settling duration based on the drift estimate comprises assigning a stage settling duration value after a determination that the drift estimate is below a threshold drift value. In some examples, the threshold drift value is the total movement of the image sequence. In some examples, the automatically adjusting the stage settling wait duration comprises estimating a stage settling duration with an artificial neural network configured to produce an output estimate for the adjustment to the stage settling wait duration based on one or more network inputs and one or more trained network layers. In some examples, the network inputs comprise one or more of: image drift data, stage command values, stage position, field of view, stage dynamics, environmental inputs, and/or time-based patterns.

According to another aspect of the disclosed technology, a charged particle microscopy system includes an imaging system, a movement stage, and a processor and memory configured with computer-executable instructions that, when executed, cause the processor to estimate a stage settling duration of the movement stage based on an image sequence obtained with the imaging system, and automatically adjust a stage settling wait duration for the movement stage based on the stage settling duration. In some examples, the computer-executable instructions are further configured to cause the imaging system to acquire an image of a sample after the adjusted stage settling wait duration has elapsed. In some examples, the computer-executable instructions are further configured to cause movement of the stage to a first location, wherein the image sequence is acquired at the first location, and movement of the stage to a second location, wherein the image of the sample is acquired at the second location after the adjusted stage settling wait duration. In some examples, the computer-executable instructions are further configured to cause movement of the stage to a first location, wherein the image sequence is acquired at the first location, wherein the estimate of the stage settling duration comprises an estimate of the stage settling duration for the stage based on the image sequence after the movement to the first location, the automatic adjustment comprises an adjustment of the stage settling wait duration during the settling of the stage at the first location, and the acquiring of the image of the sample comprises an acquiring of the image at the first location after the adjusted stage settling wait duration. In some examples, the computer-executable instructions causing the estimating the stage settling duration of the movement stage comprise instructions to estimate a stage settling duration based on the drift estimate, and wherein the computer-executable instructions causing the automatic adjusting of the stage settling wait duration comprise instructions to adjust the stage settling wait duration by a fixed amount relative to a stored stage settling wait duration in response to a change in the stage settling duration estimate. In some examples, the computer-executable instructions causing the estimating the stage settling duration of the movement stage comprise instructions to estimate a stage settling duration based on the drift estimate, and wherein the computer-executable instructions causing the automatic adjusting of the stage settling wait duration comprise instructions to adjust the stage settling wait duration to correspond to the stage settling duration estimate. In some examples, the computer-executable instructions configured to estimate the stage settling duration comprise estimating stage settling duration based on a drift estimate and assigning a stage settling duration value after a determination that the drift estimate is below a threshold drift value. In some examples, the threshold drift value is a path length difference between consecutive images of the image sequence. In some examples, the computer-executable instructions causing the automatic adjusting of the stage settling wait duration comprise instructions to produce an estimate of a stage settling duration with an artificial neural network configured to produce an output estimate for the adjustment to the stage settling wait duration based on one or more network inputs and one or more trained network layers. In some examples, the network inputs comprise one or more of: image drift data, stage command values, stage position, field of view, stage dynamics, environmental inputs, and/or time-based patterns.

According to a further aspect of the disclosed technology, apparatus include an imaging system configured to image a sample, a movement stage configured to support the sample in view of the imaging system, and an imaging controller configured to determine settling parameters of the movement stage at a first stage location based on an image sequence obtained with the imaging system, to adjust a stage settling wait duration for the movement stage based on the settling parameter, and to cause the imaging system to capture an image of the sample on the movement stage at a second location using the adjusted stage settling wait duration.

The foregoing and other objects, features, and advantages of the disclosed technology will become more apparent from the following detailed description, which proceeds with reference to the accompanying figures.

DETAILED DESCRIPTION

Figure 1:
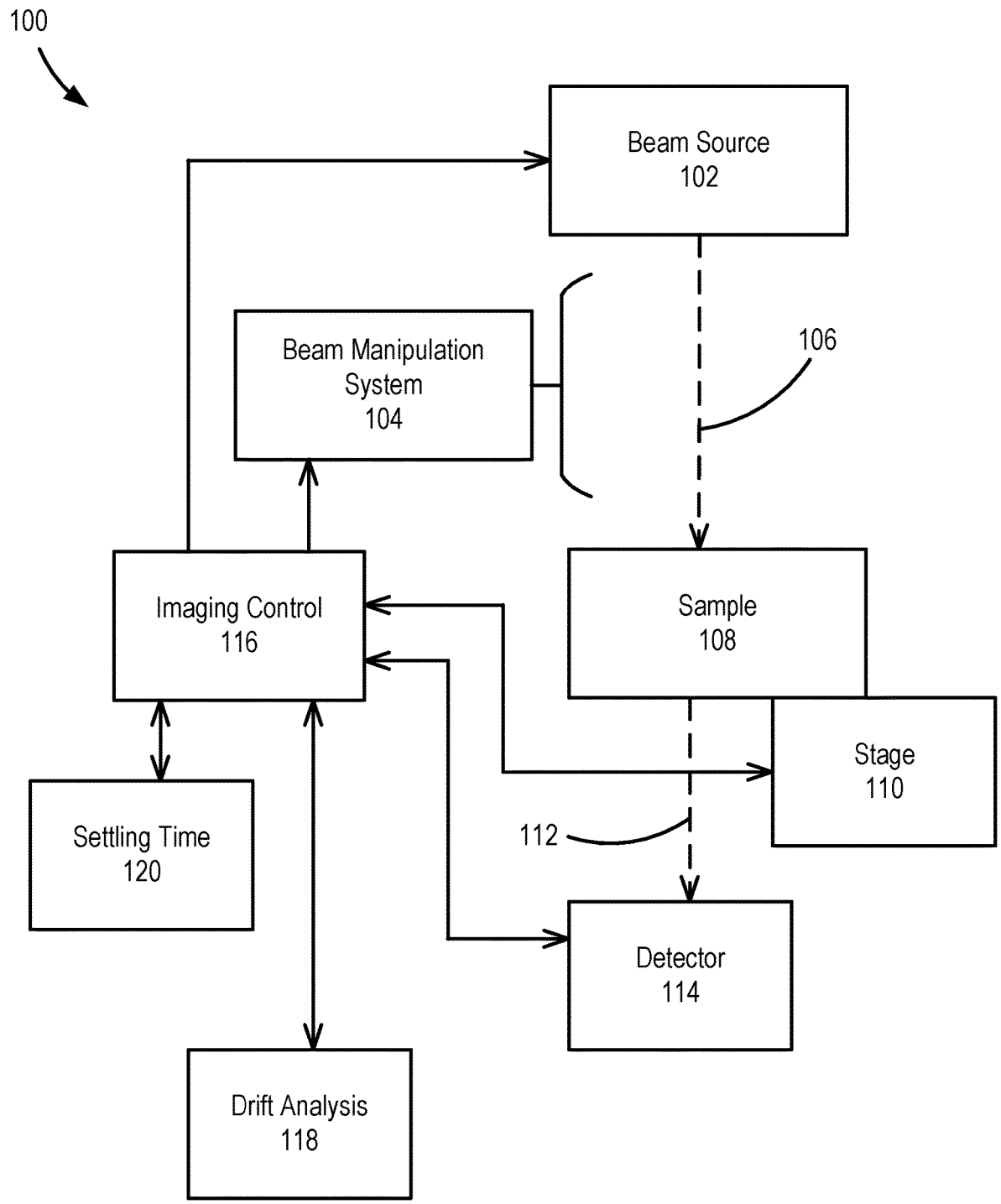
FIG. 1 is a schematic of an example microscope system.

As discussed previously, samples may be moved with a movement stage to various positions or orientations for imaging. However, after moving the sample to a new position or orientation, the stage and sample continue to move somewhat, due to stage dynamics and/or microscope conditions, e.g., the refilling of liquid nitrogen. Initially, the movement can be large including being too large for a desired next step in a high-resolution image acquisition. Thus, before imaging can proceed, a sufficient amount of waiting time or delay is needed in order to allow the various movements of the sample to attenuate until the movements are sufficiently small such that they do not limit the required resolution of the desired final image. If final images are collected before an end of the settling delay, images can be blurry or of low quality, which may require repetition of the experiment. In many microscopy applications, it is desirable to image multiple locations and/or orientations of a sample. But, as the number of movements required increases, so does the total overhead due to the accumulated amount of settling time. Particularly with quick, automated imaging series with large amounts of commanded stage movements, the problem of increased overhead is worsened when the amount of settling time required to bring the remaining stage motion below an acceptable amount is longer than the actual settling time of the stage. Therefore, settling time can directly place a constraint on throughput. Accordingly, a need remains for systems and approaches that can address throughput problems associated with settling time after movement of a sample by a movement stage.

With recent improvements in charged particle optical design (such as electron optical design), charged particle detection (such as electron detection), and image processing, atomic resolutions have been achieved. Single Particle Analysis (SPA) is a powerful technique that can benefit from such resolutions, e.g., to determine the (3D) structures of macromolecules, such as proteins. With SPA, numerous image projections of identical structure are obtained at different orientations, thereby accumulating numerous image projections of the structures that can be used to obtain 3D knowledge of the structure. SPA can be performed using cryogenic charged particle microscopy, such as electron microscopy (cryoEM). In cryoEM, macromolecule samples are arranged in an environmentally controlled microscope chamber and imaged at various positions and orientations with an electron beam. With SPA of proteins, an understanding of the 3D structure of proteins can be obtained and various protein functions can be discerned. This knowledge can then be leveraged to develop useful pharmaceutical drugs, for example.

However, a successful SPA acquisition requires dozens of well-set parameters to be configured before the image acquisition series. One of such parameters is stage settling, or waiting, time. After each stage move, a duration for the settling time is applied by the acquisition process before the image acquisition proceeds to ensure a drift of the image is within an acceptable tolerance. The settling time duration parameter is preferably a minimum amount that does not extend beyond the actual time required for the drift to reach the acceptable tolerance. Complicating the selection, the optimal setting for settling time varies from system to system and from time to time based on various inputs. One of such inputs is the dynamics of the microscope, movement stage, and local system configuration (e.g., anchoring system between the microscope and the ground, the type of ground, and other plant characteristics). Another input can include the amount and direction of the most recent stage move. Other inputs can be more difficult to model as parameters, such as regional patterns relating to temperature, vibration, etc. A static value for the settling time parameter can be used, but using a static setting for this stabilization not only increases the adoption barrier for SPA or other imaging processes with multiple stage movements by requiring extensive operator expertise, but also is not flexible enough to absorb changes during the image acquisition process. A static setting can also excessively decrease throughput where the selected settling time parameter value is conservatively selected to be much longer than the actual duration required for the image drift to be sufficiently within tolerance.

In disclosed examples, feedback is used to dynamically select stage settling time parameter values before a settled image is collected for the sample. Images are collected before the settled image collection to determine an image drift and the settling time parameter is adjusted based on the image drift. Thus, rather than using a fixed estimate for a settling time value over an image acquisition series, the settling time value can be automatically adjusted during the image acquisition process based on image behavior. The adjustment can be informed by various inputs including contemporaneous or recent image drift behavior, as well as various dynamical inputs including microscope, stage, and system dynamics, more specific dynamical patterns associated with the stage (such as amount and direction of the most recent stage move), time-specific pattern inputs (caused by environment variables such as local train schedule, power station, etc.) and other inputs. In this way, settling time duration can be increased where more delay is required to produce images sufficiently free of drift and settling time duration can be reduced where the actual drift time has a shorter duration. Corresponding acquired images can have a higher quality where the additional delay is helpful and image acquisition throughput can be improved by reducing the delay needed to obtain higher quality images. In some examples, inputs are modeled using artificial intelligence, such as with one or more convolutional neural networks, so that settling duration parameter values can be estimated based on drift patterns.

There are many barriers to more widespread deployment of SPA and other imaging techniques involving multiple stage movements, with the most significant one currently being throughput of the acquisition process. With the thousands of images required for many applications, it can be necessary to move the stage numerous times to ensure the charged particle beams (such as electron beams) are targeting the correct part of the sample. Furthermore, auxiliary image acquisition is often required to ensure all optical and mechanical conditions are correct so that the subsequent principal image acquisition can be performed. Each of the steps requires additional time which decreases throughput. For a simple material science application, only a single image might be needed, in which case spending a considerable amount of time to find and setup the single image acquisition is not a significant problem. However, with multiple stage movements (as with SPA), the requirement for thousands of images can retard throughput from one day per structure, for example, to one week or more per structure. Disclosed examples can significantly reduce the delays attendant with the multiple stage movements, thereby making practical an application that might otherwise be impractical. For example, some disclosed examples can eliminate the need to precisely configure the stage settling time parameter values before a SPA session. Also, with automated selection of the stage settling parameter value, there is a reduction in required expertise for performing image acquisition sessions, thereby allowing more users access to related applications. Furthermore, with the adaptability to various inputs and conditions, disclosed examples can be more flexible than approaches based on static settling times or session continuities. For example, dynamic settling time adjustment can sense and respond to various events, such as LN2 refilling, local seismic conditions, etc. By reducing redundant time overhead, the automatic adjustment to the settling time parameter value can significantly improve image processing throughput.

With reference to FIG. 1, a charged particle microscope 100 uses a beam source 102 and an electron beam manipulation system 104 (such as one or more electron lenses) to direct a probe beam 106 to a sample 108 of interest. Example charged particle microscopes include transmission electron microscopes, scanning electron microscopes, scanning transmission electron microscopes, and ion beam microscopes, or combinations. The sample 108 is movably supported by a stage 110, often in a controlled environment such as a cryogenically controlled vacuum chamber. In various examples, the stage 110 can translate and/or rotate the sample 108 in various directions to image different positions and/or orientations of the sample 108. The beam 106 interacts with the sample 108 and output particles 112 are received by a detector 114, such as an imaging sensor, to form an image. An imaging controller 116 can be coupled to different components of the charged particle microscope 100, such as the beam source 102, beam manipulation system 104, stage 110, and/or detector 114 to control timing and collection of the images produced with the output particles 112.

Example imaging controllers typically include one or more processing units and memories configured with processor-executable instructions to receive data from and/or send various commands to the various coupled components.

The imaging controller 116 can also include or be coupled to a drift analysis tool 118 configured to determine the drift of the sample 108 after the stage 110 moves the sample to a selected position. For example, images of the sample can be collected after the stage 110 reaches the commanded position so that a time series of images showing movement over time of the sample 108 can be collected as the stage 110 settles. The beam source 102 and/or the detector 114 can be used to collect the time series of images, or another optical source and/or detector may be used, e.g., for the purposes of drift monitoring or other diagnostics. From the time series, drift parameter values can be obtained that indicate whether the stage has sufficiently settled such that a suitable high-quality charged particle image of the sample 108 can be obtained. From the drift parameter values, an actual settling time of the stage 110 can be determined. A settling time parameter value 120 can then be determined based on the actual settling time for use in the imaging acquisition process. In some examples, the determined settling time can correspond to the actual settling time. In further examples, other inputs may be used or compared with the actual settling time to determine the settling time parameter value 120.

In many examples, the sample 108 is imaged according to an automated sequence where the sample 108 is imaged and moved by the stage 110 numerous times to collect many images across multiple positions and orientations. Such image acquisition sequences can be relatively rapid, allowing minimal time to determine the settling time parameter value 120. In many instances, previously determined settling time parameter values can be used, e.g., values determined after a preceding movement has settled. Thus, a stage settling image sequence from a first location can be used to determine a settling time for a second location, a stage settling image sequence from the second location can be used to determine a settling time for a third location, and so on. Example stage settling image sequences can include principal image sequences acquired at a location corresponding to intended process images (e.g., SPA projections) of the sample or auxiliary images of the sample (e.g., low-resolution tracking images or images acquired for another purpose). In further examples, computer and communication processing delays associated with computation and analysis of image drift of the sample is sufficiently rapid in relation to the image acquisition process involving imaging, stage movement, and associated settling such that the drift analysis tool 118 and settling time parameter value 120 can be applied to a current imaging location. In some instances, other inputs (such as settling patterns) can be used to define the settling time. For example, image sequences collected from principal or intended sets of images or an auxiliary image stacks may be used. In selected examples, the drift analysis tool 118 can be used to estimate the settling time parameter value 120 based on a collection of drift images before movement of the sample 108 has sufficiently ceased for acquisition of the process image. For example, drift values can be compared against predicted drift based on settling patterns. Drift values can also be used to estimate time-series attenuation or damping characteristics of drift before a below-threshold settling time is reached, and the estimates can be used to further estimate settling time parameter values such as by extrapolation of attenuation to below-threshold settling time durations.

Figure 2A:
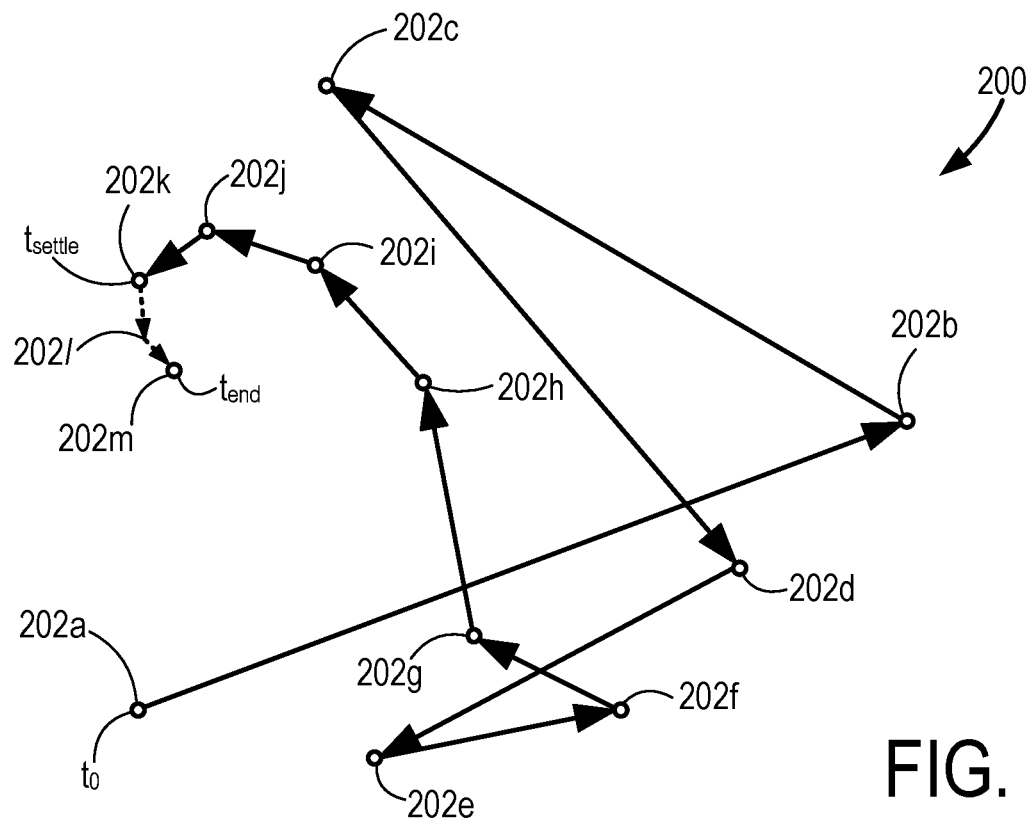
FIG. 2A is a plan view of an image drift after movement of a sample to a commanded location.
Figure 2B:
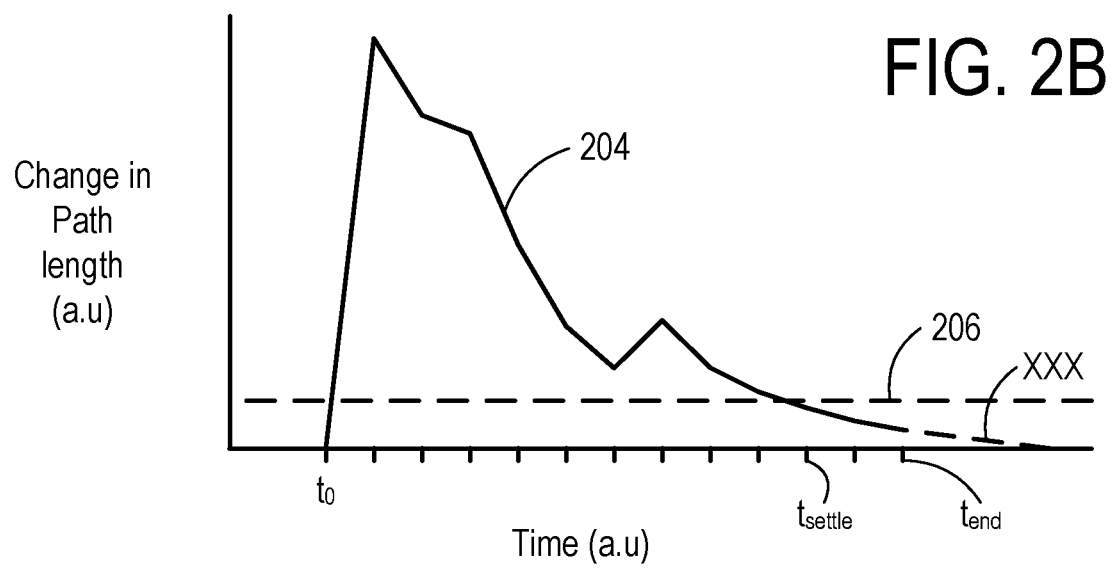
FIG. 2B is a plot of the image drift shown in FIG. 2A with respect to time.

FIG. 2A is an example image drift trajectory 200 for a sample supported by a movement stage. For convenience of illustration, a time to can correspond to the moment when stage movement to a new imaging location is completed. However, because of drift dynamics, the sample continues to move. Trajectory position markers 202a-202m can correspond to a common location of the sample (or stage) over time and respective arrows show the change in path length for the time increments associated with the position markers 202a-202m. A series of camera images can be collected from an initial time $t_0$ to an end time $t_{end}$, e.g., at a frame rate of the camera sensor, though it will be appreciated that drift images can be collected at various or variable rates in different examples. With line 204, FIG. 2B shows the change in path length over time of the arrow lengths in FIG. 2A associated with the drift images. In a typical drift path, the change in path length decreases over time and the path length can fall below a threshold drift amount 206, e.g., at a time $t_{settle}$. In some examples, the duration $t_{settle}$-$t_0$ can be used to determine a settling time parameter value for current or subsequent stage movements. In some examples, the duration $t_{settle}$-$t_0$ itself can be used as stored settling time parameter value. In further examples, the duration $t_{settle}$-$t_0$ can be compared with an existing stored settling time parameter value, and values can be increased or decreased by fixed or variable amounts based on the comparison. A stated above, the initial time to corresponds to an arrival time of the movement stage at the new imaging location. However, other times are possible, typically between the arrival time and the end time $t_{end}$.

Generally available drift analysis tools include software modules that can be used to perform drift analyses. Such tools typically compare temporally adjacent movie frames to define movement paths or curves associated with a drift. Drift curves can have many characteristics, such as total drift, arclength, directional change, vibrational parameters, etc. After moving the microscope field of view to a new position, the series of acquired images can provide the series of movie frames for the drift analysis software module. The module can then determine, based on the movie, how much drift occurs at that position. By measuring the drift between the frames, the delay between each of the frames, and the timescale, the drift can be estimated, e.g., nm/s, and used to determine a settling time for the next acquisition area.

Figure 3:
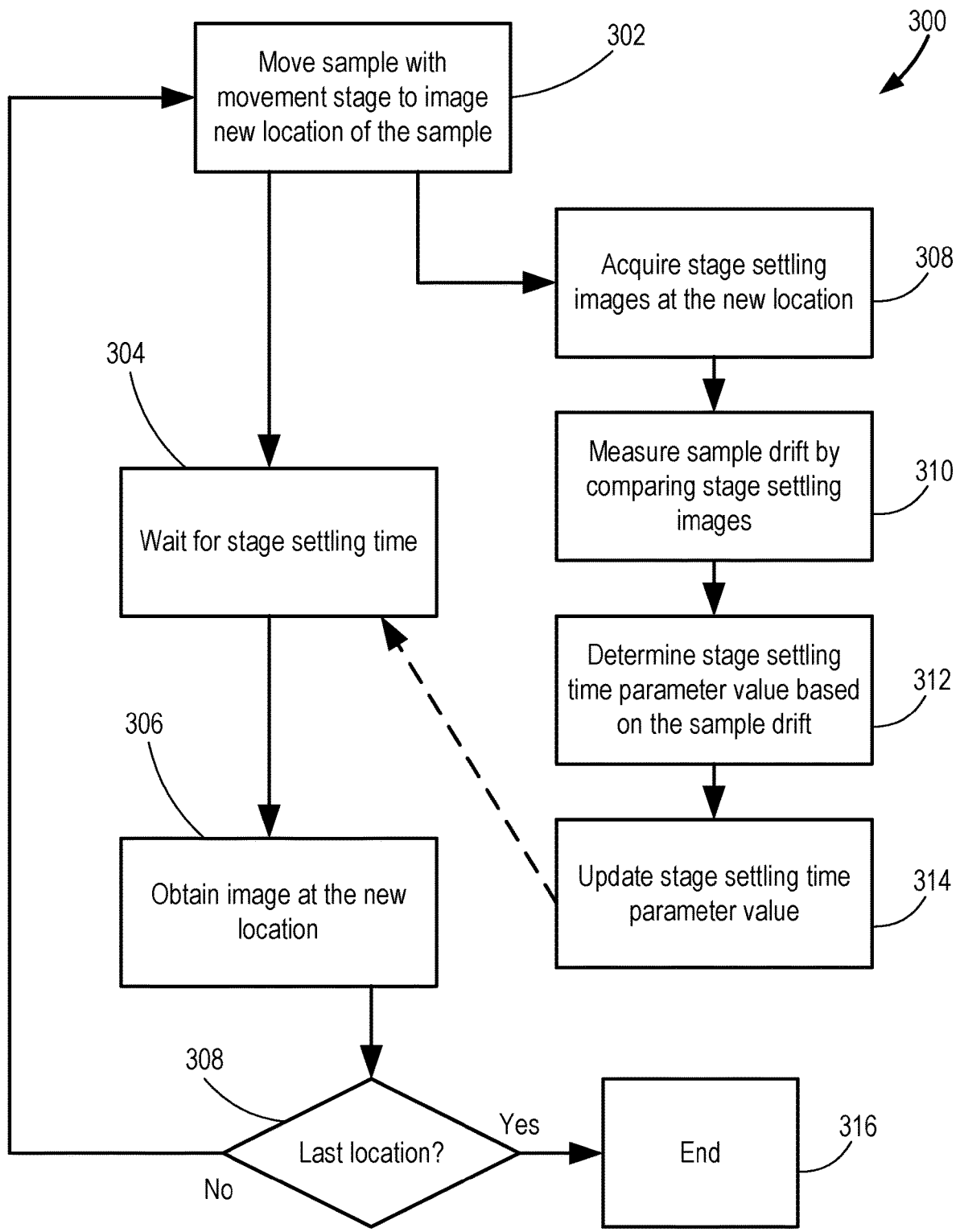
FIG. 3 is a flowchart of an example method of adjusting a stage settling parameter value.

FIG. 3 is an example image processing method 300 that can be used to image multiple locations of a sample through movement of the sample by a movement stage to the respective locations. At 302, the sample is moved with the movement stage to image new location so that the sample can be imaged at the new location. At 304, the process waits for a stage settling time based on a stored stage settling time parameter value. At 306, an image acquisition process commences, e.g., by obtaining one or more process images (such as high-resolution charged particle microscopy images) at the new location. When the sample is moved to an initial location of a series of locations, the stored stage settling time parameter can have a preset value, which can be conservatively selected to ensure that image acquisition at 306 does not result in a blurry, distorted, or low-quality image due to image drift caused by settling of the movement stage.

After the movement to the new location, at 308 a time series of images of the sample is collected. In representative examples, the time series or one or more of the images of the time series collected at 308 can correspond to images collected at 306, e.g., making 306 and 308 a common acquisition step. At 310, a sample drift can be measured based on comparison between the images of the time series and the distance scale of the images. At 312, a stage settling time parameter value is determined based on the sample drift. For example, determined stage settling time parameter values times can correspond to actual settling times, e.g., at or close a zero-drift value, or below a selected drift movement threshold. Some determined stage settling time parameter values can correspond to stored value increased or decreased by a fixed or variable amount, in relation to sample drift over time measured at 310. For example, various open-loop or closed-loop control methods may be used to control the stage settling time parameter value around a setpoint, such as a drift threshold or a measured settling time associated with a threshold drift. In some examples, settling time parameter values can be determined with an artificial neural network, based on various inputs. Example inputs can include actual settling times, drift or settling time profiles, microscope and stage dynamics, commanded movement locations, and other environmental inputs such as periodic dynamical patterns. Trained or untrained artificial neural networks can provide settling time parameter value output estimates corresponding to the determined state settling time parameter value.

At 314, the determined stage settling time parameter value is then used to update and replace the stored stage settling time parameter value. Typically, due to image collection and drift and stage settling analysis, the updating of the stage settling time parameter value occurs after completion of the image acquisition process at 306. After the image acquisition process is performed at 306, a check is performed as to whether additional movement stage movements are needed so as to obtain additional images at other sample locations. If the movements are complete the process may end at 316. Alternatively, the sample can be moved to a new location at 302, e.g., so that the image acquisition process can be performed at the new subsequent location. In representative examples, the replaced stored stage settling time parameter value is then used for the new location, e.g., after the check 308 and new movement. In some examples, the process of updating the stage settling time parameter value with a new determined value, e.g., via 308-314, can be sufficiently rapid such that the updated stage settling time parameter value can be applied to the current stage movement.

In a selected example, a wait duration value is determined after a mechanical move of a stage, based on a drift determined by camera motion correction. The drift is corrected and characterized via the motion correction software component. The drift path can be described as a set (x,y) of parametric equations as a function of time, each of which can be a cubic polynomial. The total drift is taken as the path length over 't' time, where 't' is the number of motion correction fractions. If the drift is above a selected threshold, the stage waiting time is incremented, otherwise it is decremented, thereby providing a dynamic adjustment to stage wait durations. After a stage wait duration value is determined, it can be used for multiple locations of a sample, such as by being specified for all foil holes of a current grid square of a sample. If a foil hole has more than one motion correction drift (from multiple particles), the maximal drift can be considered. If more than one foil hole in a grid square has motion correction results, the most recent foil hole can be used. Wait durations can be determined for different sets of locations, such as for grid squares or regions of a sample, movement by movement basis, etc.

Figure 4:
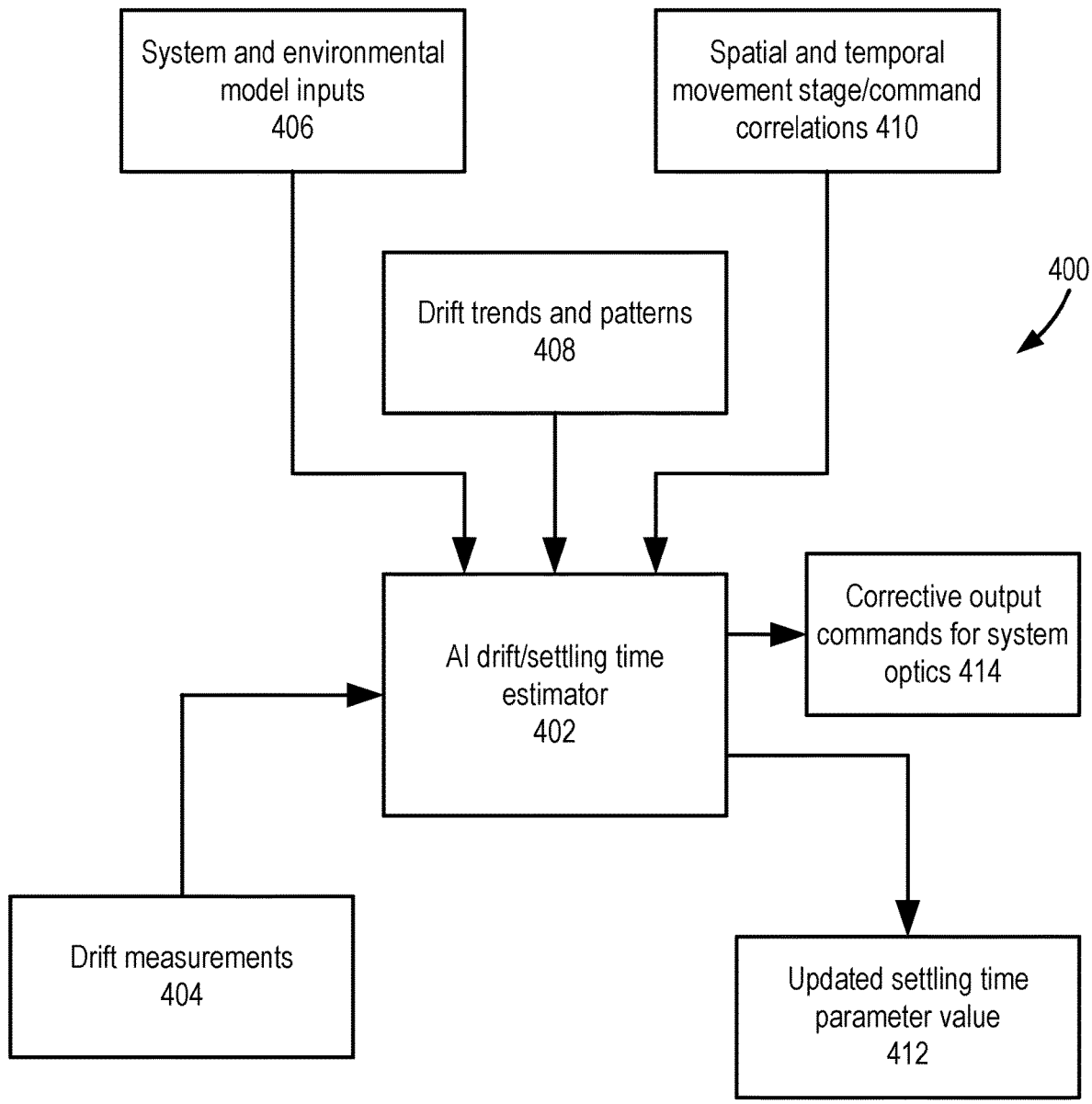
FIG. 4 is a schematic of an example neural network approach to settling time parameter value estimation.

FIG. 4 shows a system 400 that adjusts a settling time parameter value of an imaging system to reduce imaging acquisition process throughput. An AI drift and/or settling time estimator 402 is situated to receive various inputs, including drift measurements 404 and other static and/or dynamic inputs. Other inputs can include modeled and/or actual system and/or environmental inputs 406, trends or patterns of sample or stage drift 408, and/or spatial and/or temporal movement stage/command correlations 410. The AI drift and settling time estimator 402 can produce an updated settling time parameter value 412 based on one or more of the various inputs. In some examples, other parameter values may be adjusted based on estimations produced by the estimator 402. For example, drift pattern predictions from the estimator 402 can be used to produce corrective output commands 414 for various optical components. In some examples, in response to selected drift pattern predictions, lenses, emitters, or other microscope components can be adjusted to provide corrections for various imaging errors, such as distortion, beam deflection position, drift movement, etc.

In many examples, drift prediction is separate from settling time determination. In some examples, the AI drift and/or settling time estimator 402 can use neural networks or other machine-learning (ML) techniques to determine correlations between various inputs and the resulting drift behavior. In selected examples, a primitive model is used to fit to a small number of measurements. A settling time estimate can then be produced with the estimator 402 by applying a rule to the predictions of the primitive model. In some examples, if a drift follows an exponential decay curve, images can be acquiring early based on the knowledge that subsequent acquisitions will be obtained during a time when the drift is acceptable. In many examples, estimates of the settling time parameter can be based on drift measurements or drift estimates. Various inputs to the estimator 402 can be provided, such as image drift data, stage commanded values, field of view positions, stage dynamics (including stage position), environmental inputs (including temperature, humidity, season, etc.), and other pattern inputs such as liquid nitrogen filling.

Figure 5:
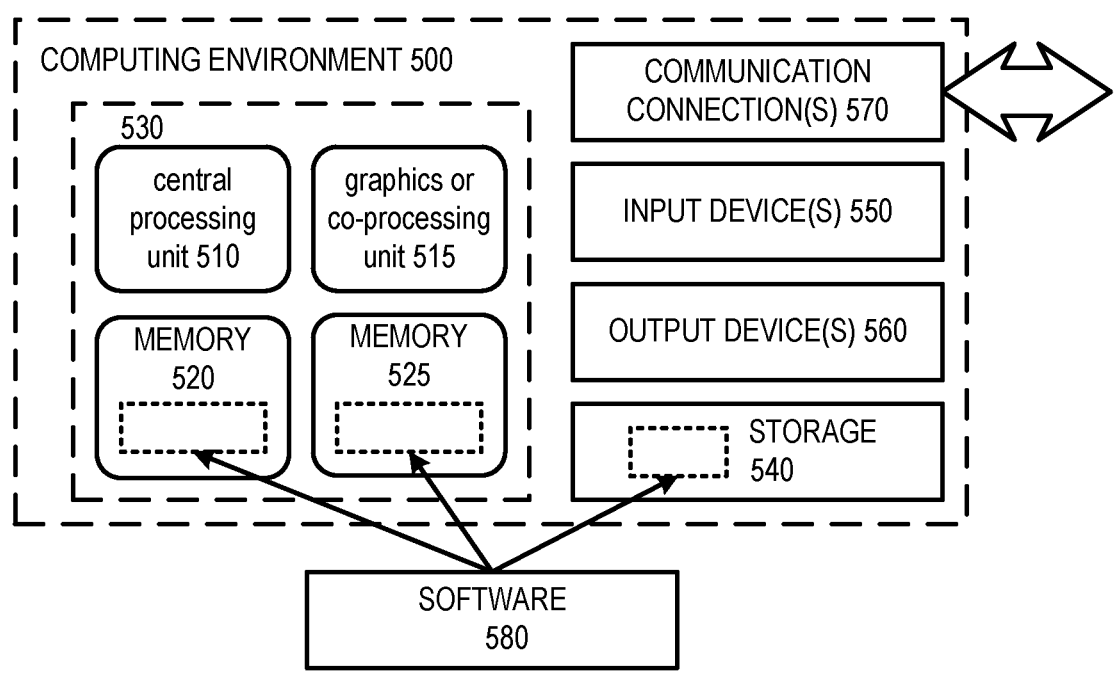
FIG. 5 is a schematic of an example computing system in which some described examples can be implemented.

FIG. 5 depicts a generalized example of a suitable computing system 500 in which the described innovations may be implemented. The computing system 500 is not intended to suggest any limitation as to scope of use or functionality of the present disclosure, as the innovations may be implemented in diverse general-purpose or special-purpose computing systems.

With reference to FIG. 5, the computing system 500 includes one or more processing units 510, 515 and memory 520, 525. In FIG. 5, this basic configuration 530 is included within a dashed line. The processing units 510, 515 execute computer-executable instructions, such as for implementing components of the computing environments of, or providing the data (e.g., image drift data, settling time data, etc.) outputs shown in, FIGS. 1-4, described above. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 5 shows a central processing unit 510 as well as a graphics processing unit or co-processing unit 515. The tangible memory 520, 525 may be volatile memory (e.g., registers, cache, RAM), non-volatile memory (e.g., ROM, EEPROM, flash memory, etc.), or some combination of the two, accessible by the processing unit(s) 510, 515. The memory 520, 525 stores software 580 implementing one or more innovations described herein, in the form of computer-executable instructions suitable for execution by the processing unit(s) 510, 515.

A computing system 500 may have additional features. For example, the computing system 500 includes storage 540, one or more input devices 550, one or more output devices 560, and one or more communication connections 570. An interconnection mechanism (not shown) such as a bus, controller, or network interconnects the components of the computing system 500. Typically, operating system software (not shown) provides an operating environment for other software executing in the computing system 500, and coordinates activities of the components of the computing system 500.

The tangible storage 540 may be removable or non-removable, and includes magnetic disks, magnetic tapes or cassettes, CD-ROMs, DVDs, or any other medium which can be used to store information in a non-transitory way and which can be accessed within the computing system 500. The storage 540 stores instructions for the software 580 implementing one or more innovations described herein.

The input device(s) 550 may be a touch input device such as a keyboard, mouse, pen, or trackball, a voice input device, a scanning device, or another device that provides input to the computing system 500. The output device(s) 560 may be a display, printer, speaker, CD-writer, or another device that provides output from the computing system 500.

The communication connection(s) 570 enable communication over a communication medium to another computing entity, such as between microscope control interfaces, image drift analysis tools, settling time estimation networks, and cloud computing systems. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Figure 6:
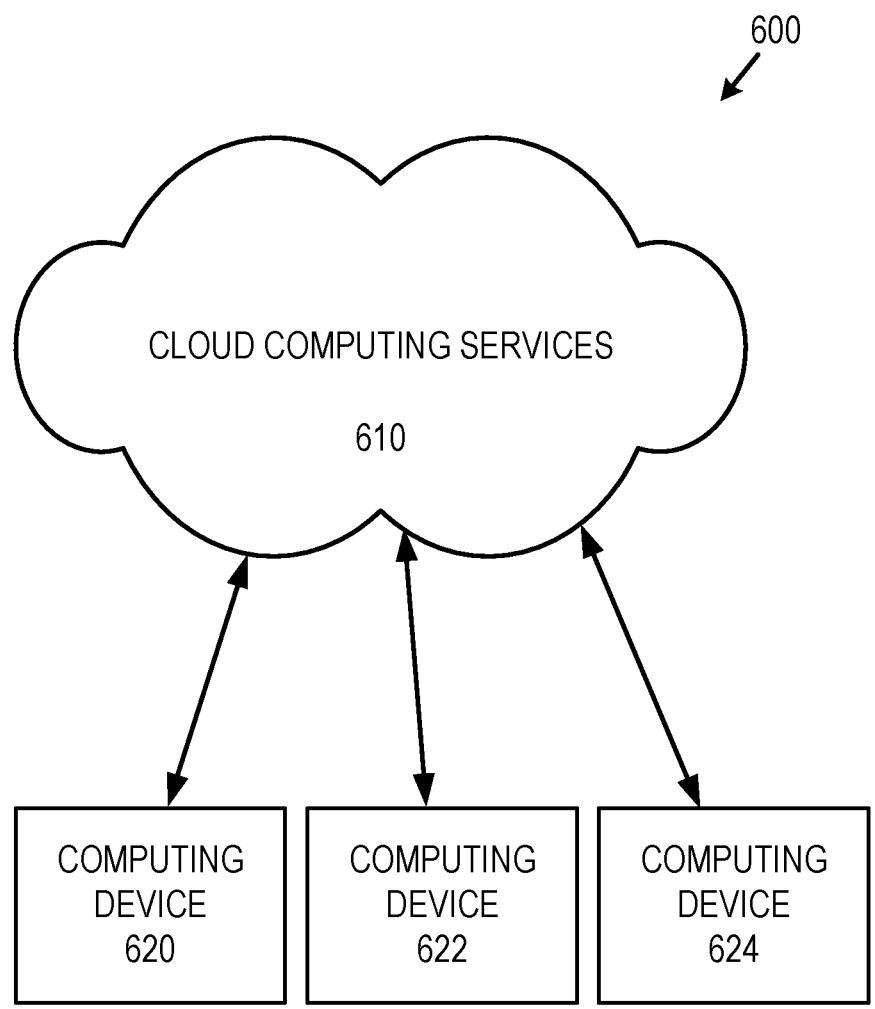
FIG. 6 is schematic of an example cloud computing environment that can be used in conjunction with the technologies described herein.

FIG. 6 depicts an example cloud computing environment 600 in which the described technologies can be implemented. The cloud computing environment 600 includes cloud computing services 610. The cloud computing services 610 can comprise various types of cloud computing resources, such as computer servers, data storage repositories, networking resources, etc. The cloud computing services 610 can be centrally located (e.g., provided by a data center of a business or organization) or distributed (e.g., provided by various computing resources located at different locations, such as different data centers and/or located in different cities or countries). The cloud computing services 610 are utilized by various types of computing devices (e.g., client computing devices), such as computing devices 620, 622, and 624. For example, the computing devices (e.g., 620, 622, and 624) can be computers (e.g., desktop or laptop computers), mobile devices (e.g., tablet computers or smart phones), or other types of computing devices. For example, the computing devices (e.g., 620, 622, and 624) can utilize the cloud computing services 610 to perform computing operations, e.g., data processing (such as drift analysis, settling time parameter estimation including neural network based estimation, etc.), data storage (such as model inputs and related data, settling time parameters, network training information, etc.), and the like.

GENERAL CONSIDERATIONS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system. In general, a computing system or computing device can be local or distributed, and can include any combination of special-purpose hardware and/or general-purpose hardware with software implementing the functionality described herein.

In various examples described herein, a module (e.g., component or engine) can be "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Described algorithms may be, for example, embodied as software or firmware instructions carried out by a digital computer. For instance, any of the disclosed image processing, drift analyses, drift estimations, and/or automation techniques can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques or subsets of techniques. The results of the computations can be stored in the one or more tangible, non-transitory computer-readable storage media and/or can also be output to the user, for example, by displaying, on a display device, image drifts, image time series, settling characteristics, and/or image data.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use.

We claim:

1. A computer-implemented method for controlling a charged particle microscopy system, comprising:
   estimating a drift of a stage of the charged particle microscopy system based on an image sequence; and
   automatically adjusting a stage settling wait duration based on the drift estimate.

2. The method of claim 1, further comprising acquiring an image of a sample after the adjusted stage settling wait duration has elapsed.

3. The method of claim 2, further comprising:
moving the stage to a first location, wherein the image sequence is acquired at the first location; and
moving the stage to a second location, wherein the image of the sample is acquired at the second location after the adjusted stage settling wait duration.

4. The method of claim 2, further comprising:
moving the stage to a first location, wherein the image sequence is acquired at the first location, wherein:
the estimating the drift comprises estimating the drift of the stage based on the image sequence after the movement to the first location,
the automatically adjusting comprises adjusting the stage settling wait duration during the settling of the stage at the first location, and
the acquiring the image of the sample comprises acquiring the image at the first location after the adjusted stage settling wait duration.

5. The method of claim 1, wherein the automatically adjusting the stage settling wait duration comprises:
estimating a stage settling duration based on the drift estimate; and
adjusting the stage settling wait duration by a fixed amount in response to a change in the stage settling duration estimate relative to a stored stage settling wait duration.

6. The method of claim 1, wherein the automatically adjusting the stage settling wait duration comprises:
estimating a stage settling duration based on the drift estimate; and
adjusting the stage settling wait duration to correspond to the stage settling duration estimate.

7. The method of claim 6, wherein the estimating the stage settling duration based on the drift estimate comprises assigning a stage settling duration value after a determination that the drift estimate is below a threshold drift value.

8. The method of claim 7, wherein the threshold drift value is the total movement of the image sequence.

9. The method of claim 1, wherein the automatically adjusting the stage settling wait duration comprises:
estimating a stage settling duration with an artificial neural network configured to produce an output estimate for the adjustment to the stage settling wait duration based on one or more network inputs and one or more trained network layers.

10. The method of claim 9, wherein the network inputs comprise one or more of: image drift data, stage command values, stage position, field of view, stage dynamics, environmental inputs, and/or time-based patterns.

11. A charged particle microscopy system, comprising:
an imaging system;
a movement stage; and
a processor and memory configured with computer-executable instructions that, when executed, cause the processor to:
estimate a stage settling duration of the movement stage based on an image sequence obtained with the imaging system; and
automatically adjust a stage settling wait duration for the movement stage based on the stage settling duration.

12. The system of claim 11, wherein the computer-executable instructions are further configured to cause the imaging system to acquire an image of a sample after the adjusted stage settling wait duration has elapsed.

13. The system of claim 12, wherein the computer-executable instructions are further configured to cause:
movement of the stage to a first location, wherein the image sequence is acquired at the first location; and
movement of the stage to a second location, wherein the image of the sample is acquired at the second location after the adjusted stage settling wait duration.

14. The system of claim 12, wherein the computer-executable instructions are further configured to cause:
movement of the stage to a first location, wherein the image sequence is acquired at the first location, wherein:
the estimate of the stage settling duration comprises an estimate of the stage settling duration for the stage based on the image sequence after the movement to the first location,
the automatic adjustment comprises an adjustment of the stage settling wait duration during the settling of the stage at the first location, and
the acquiring of the image of the sample comprises an acquiring of the image at the first location after the adjusted stage settling wait duration.

15. The system of claim 11, wherein the computer-executable instructions causing the estimating the stage settling duration of the movement stage comprise instructions to estimate a stage settling duration based on the drift estimate; and
wherein the computer-executable instructions causing the automatic adjusting of the stage settling wait duration comprise instructions to adjust the stage settling wait duration by a fixed amount relative to a stored stage settling wait duration in response to a change in the stage settling duration estimate.

16. The system of claim 11, wherein the computer-executable instructions causing the estimating the stage settling duration of the movement stage comprise instructions to estimate a stage settling duration based on the drift estimate; and
wherein the computer-executable instructions causing the automatic adjusting of the stage settling wait duration comprise instructions to adjust the stage settling wait duration to correspond to the stage settling duration estimate.

17. The system of claim 16, wherein the computer-executable instructions configured to estimate the stage settling duration comprise estimating stage settling duration based on a drift estimate and assigning a stage settling duration value after a determination that the drift estimate is below a threshold drift value.

18. The system of claim 17, wherein the threshold drift value is a path length difference between consecutive images of the image sequence.

19. The system of claim 11, wherein the computer-executable instructions causing the automatic adjusting of the stage settling wait duration comprise instructions to produce an estimate of a stage settling duration with an artificial neural network configured to produce an output estimate for the adjustment to the stage settling wait duration based on one or more network inputs and one or more trained network layers.

20. An apparatus, comprising:
an imaging system configured to image a sample;
a movement stage configured to support the sample in view of the imaging system; and
an imaging controller configured to determine settling time parameters of the movement stage at a first stage location based on an image sequence obtained with the imaging system, to adjust a stage settling wait duration for the movement stage based on the settling time parameter, and to cause the imaging system to capture an image of the sample on the movement stage at a second location using the adjusted stage settling wait duration.

* * * * *